United States Patent
Ho et al.

(10) Patent No.: US 9,419,050 B2
(45) Date of Patent: Aug. 16, 2016

(54) MANUFACTURING METHOD OF SEMICONDUCTOR STRUCTURE WITH PROTEIN TAPE

(71) Applicant: XINTEC INC., Taoyuan (TW)

(72) Inventors: Yen-Shih Ho, Kaohsiung (TW); Shu-Ming Chang, New Taipei (TW); Yung-Tai Tsai, New Taipei (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/703,796

(22) Filed: May 4, 2015

(65) Prior Publication Data

US 2015/0340403 A1    Nov. 26, 2015

(30) Foreign Application Priority Data

May 22, 2014    (TW) ............................... 103117920 A

(51) Int. Cl.
*H01L 27/146*    (2006.01)
*H01L 21/683*    (2006.01)
*H01L 21/67*    (2006.01)
*H01L 31/18*    (2006.01)

(52) U.S. Cl.
CPC .... *H01L 27/14687* (2013.01); *H01L 21/67092* (2013.01); *H01L 21/6836* (2013.01); *H01L 27/14685* (2013.01); *H01L 31/18* (2013.01)

(58) Field of Classification Search
CPC ..................... H01L 21/67092; H01L 21/6836; H01L 27/14687; H01L 27/14685
See application file for complete search history.

(56) References Cited

U.S. PATENT DOCUMENTS

| | | | |
|---|---|---|---|
| 2007/0054419 A1* | 3/2007 | Paik .................. | H01L 27/14618 438/1 |
| 2013/0147063 A1* | 6/2013 | Park ........................ | H01L 24/96 257/777 |
| 2013/0295725 A1* | 11/2013 | Park ........................ | H01L 24/19 438/124 |

* cited by examiner

*Primary Examiner* — Mamadou Diallo
(74) *Attorney, Agent, or Firm* — Liu & Liu

(57) ABSTRACT

A manufacturing method of a semiconductor structure includes the following steps. A temporary bonding layer is used to adhere a carrier to a first surface of a wafer. A second surface of the wafer is adhered to an ultraviolet tape on a frame, and the temporary bonding layer and the carrier are removed. A protection tape is adhered to the first surface of the wafer. An ultraviolet light is used to irradiate the ultraviolet tape. A dicing tape is adhered to the protection tape and the frame, and the ultraviolet tape is removed. A first cutter is used to dice the wafer from the second surface of the wafer, such that plural chips and plural gaps between the chips are formed. A second cutter with a width smaller than the width of the first cutter is used to cut the protection tape along the gaps.

12 Claims, 15 Drawing Sheets

| A temporary bonding layer is used to adhere a carrier to a first surface of a wafer, such that the temporary bonding layer covers an image-sensing region of the wafer. | ─ S1 |

⇩

| The wafer is etched to form a plurality of chips and a plurality of gaps between the chips, and a redistribution layer, an isolation layer, and a ball grid array are formed on a second surface of the wafer opposite to the first surface. | ─ S2 |

⇩

| The second surface of the wafer is adhered to an ultraviolet tape that is located on a frame, and the carrier is removed, and the area of the temporary bonding layer is larger than the area of the wafer, such that the temporary bonding layer protrudes from the wafer. | ─ S3 |

⇩

| A cutter with a wide that is smaller than the wide of each of the gaps is used to cut positions of the temporary bonding layer aligned with the gaps, such that the cut temporary bonding layers respectively protrude from the chips. | ─ S4 |

⇩

| Ultraviolet light is used to irradiate the ultraviolet tape, such that the adhesion of the ultraviolet tape is eliminated. | ─ S5 |

Fig. 19

MANUFACTURING METHOD OF SEMICONDUCTOR STRUCTURE WITH PROTEIN TAPE

RELATED APPLICATIONS

This application claims priority to Taiwanese Application Serial Number 103117920, filed May 22, 2014, which is herein incorporated by reference.

BACKGROUND

1. Field of Invention

The present invention relates to a manufacturing method of a semiconductor structure.

2. Description of Related Art

When a chip designed to be as an image sensor (e.g., a CMOS chip) is manufactured, a glass sheet is often used to cover the surface of the wafer for protection, such that dust is not apt to attach to the image-sensing region of the wafer. When the chip formed by dicing the wafer is used in an electronic product, a light transmissive sheet is often disposed on a housing of the electronic product aligned with the chip, and the light transmissive sheet has a protection function similar to a glass sheet on the surface of the wafer, thereby wasting material cost and reducing light transmittance.

However, when the glass sheet is not disposed on the surface of the wafer, although the light transmittance may be improved to enhance the image-sensing capability of the chip that is formed by dicing the wafer, the thickness of the wafer is significantly thin and it is very difficult to move such a wafer which has a ball grid array.

Moreover, if there is no other element to protect the image-sensing region during an image sensor manufacturing process, the image-sensing region is apt to be polluted by dust, such that the yield rate of image sensor is difficult to be improved. Although a tape may be used to cover the image-sensing region to protect the image-sensing region during the manufacturing process, the tape without any design is difficult to remove from the wafer after being cut (i.e., the chip), which is an inconvenient factor for manufacturers.

SUMMARY

An aspect of the present invention is to provide a manufacturing method of a semiconductor structure.

According to an embodiment of the present invention, a manufacturing method of a semiconductor structure includes the following steps. (a) A temporary bonding layer is used to adhere a carrier to a first surface of a wafer, and a redistribution layer, an isolation layer, and a ball grid array are formed on a second surface of the wafer opposite to the first surface. (b) The second surface of the wafer is adhered to an ultraviolet tape that is located on a frame, and the temporary bonding layer and the carrier are removed. (c) A protection tape is adhered to the first surface of the wafer to cover an image-sensing region of the wafer, and the area of the protection tape is larger than the area of the wafer, such that the protection tape protrudes from the wafer. (d) Ultraviolet light is used to irradiate the ultraviolet tape, such that the adhesion of the ultraviolet tape is eliminated. (e) A dicing tape is adhered to the protection tape and the frame, and the ultraviolet tape is removed. (f) A first cutter is used to dice the wafer from the second surface of the wafer, such that a plurality of chips and a plurality of gaps between the chips are formed. (g) A second cutter with a width that is smaller than the width of the first cutter is used to cut the protection tape along the gaps, such that the cut protection tapes respectively protrude from the chips.

In the aforementioned embodiments of the present invention, the carrier may provide a supporting force for the wafer before the ball grid array is formed on the wafer. After the second surface of the wafer is adhered to the ultraviolet tape, the temporary bonding layer and the carrier may be removed. The carrier and the protection tape both can protect the image-sensing region of the wafer, such that the image-sensing region is prevented from pollution in a manufacturing process, and the yield rate of the semiconductor structure may be improved. In addition, since the area of the protection tape is larger than the area of the wafer and the wider first cutter is used to cut the wafer and the narrower second cutter is used to cut the protection tape, each of the protection tapes on one of the chips protrudes from the corresponding chip after the wafer and the protection tape are cut. As a result, the protection tapes may be easily torn from the edges of the chips, thereby improving convenience in manufacture. Moreover, the chip after the carrier and the protection tape are removed may enhance the sensing capability of the chip, and the cost of disposing a glass sheet on a chip in conventional art is saved.

An aspect of the present invention is to provide a manufacturing method of a semiconductor structure.

According to an embodiment of the present invention, a manufacturing method of a semiconductor structure includes the following steps. (a) A temporary bonding layer is used to adhere a carrier to a first surface of a wafer. (b) The wafer is etched to form a plurality of chips and a plurality of gaps between the chips, and a redistribution layer, an isolation layer, and a ball grid array are formed on a second surface of the wafer opposite to the first surface. (c) The second surface of the wafer is adhered to an ultraviolet tape that is located on a frame, and the temporary bonding layer and the carrier are removed. (d) A protection tape is adhered to the first surface of the wafer to cover an image-sensing region of the wafer, and the area of the protection tape is larger than the area of the wafer, such that the protection tape protrudes from the wafer. (e) Ultraviolet light is used to irradiate the ultraviolet tape, such that the adhesion of the ultraviolet tape is eliminated. (f) A dicing tape is adhered to the protection tape and the frame, and the ultraviolet tape is removed. (g) A cutter with a width that is smaller than the width of each of the gaps is used to cut the protection tape along the gaps, such that the cut protection tapes respectively protrude from the chips.

In the aforementioned embodiments of the present invention, the carrier may provide a supporting force for the wafer before the ball grid array is formed on the wafer. After the second surface of the wafer is adhered to the ultraviolet tape, the temporary bonding layer and the carrier may be removed. The carrier and the protection tape both can protect the image-sensing region of the wafer, such that the image-sensing region is prevented from pollution in a manufacturing process, and the yield rate of the semiconductor structure may be improved. In addition, when the wafer is etched, chips and gaps may be formed. Since the area of the protection tape is larger than the area of the wafer and the cutter with a width that is smaller than the width of the gap is used to cut the protection tape, each of the protection tapes on one of the chips protrudes from the corresponding chip after the protection tape is cut. As a result, the protection tapes may be easily torn from the edges of the chips, thereby improving convenience in manufacturing. Moreover, the chip after the carrier and the protection tape are removed may enhance the sensing capability of the chip, and the cost of disposing a glass sheet on a chip in conventional art is saved.

An aspect of the present invention is to provide a manufacturing method of a semiconductor structure.

According to an embodiment of the present invention, a manufacturing method of a semiconductor structure includes the following steps. (a) A temporary bonding layer is used to adhere a carrier to a first surface of a wafer, such that the temporary bonding layer covers an image-sensing region of the wafer. (b) The wafer is etched to form a plurality of chips and a plurality of gaps between the chips, and a redistribution layer, an isolation layer, and a ball grid array are formed on a second surface of the wafer opposite to the first surface. (c) The second surface of the wafer is adhered to an ultraviolet tape that is located on a frame, and the carrier is removed, and the area of the temporary bonding layer is larger than the area of the wafer, such that the temporary bonding layer protrudes from the wafer. (d) A cutter with a width that is smaller than the width of each of the gaps is used to cut positions of the temporary bonding layer aligned with the gaps, such that the cut temporary bonding layers respectively protrude from the chips. (e) Ultraviolet light is used to irradiate the ultraviolet tape, such that the adhesion of the ultraviolet tape is eliminated.

In the aforementioned embodiments of the present invention, the carrier may provide a supporting force for the wafer before the ball grid array is formed on the wafer. After the second surface of the wafer is adhered to the ultraviolet tape, the carrier may be removed. The carrier and the temporary bonding layer both can protect the image-sensing region of the wafer, such that the image-sensing region is prevented from pollution in a manufacturing process, and the yield rate of the semiconductor structure may be improved. In addition, when the wafer is etched, chips and gaps may be formed. Since the area of the temporary bonding layer is larger than the area of the wafer and the cutter with a width that is smaller than the width of the gap is used to cut the temporary bonding layer, each of the temporary bonding layers on one of the chips protrudes from the corresponding chip after the temporary bonding layer is cut. As a result, the temporary bonding layers may be easily torn from the edges of the chips, thereby improving convenience in manufacturing. Moreover, the chip after the carrier and the temporary bonding layer are removed may enhance the sensing capability of the chip, and the cost of disposing a glass sheet on a chip in conventional art is saved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 7 is a schematic view of the protection tape and a frame shown in

FIG. 6 after being adhered to a dicing tape;

FIG. 9 is a schematic view of the chip and the protection tape shown in

FIG. 8B after being obtained from the dicing tape;

FIG. 19 is a flow chart of a manufacturing method of a semiconductor structure according to one embodiment of the present invention;

DETAILED DESCRIPTION

Figure 1:
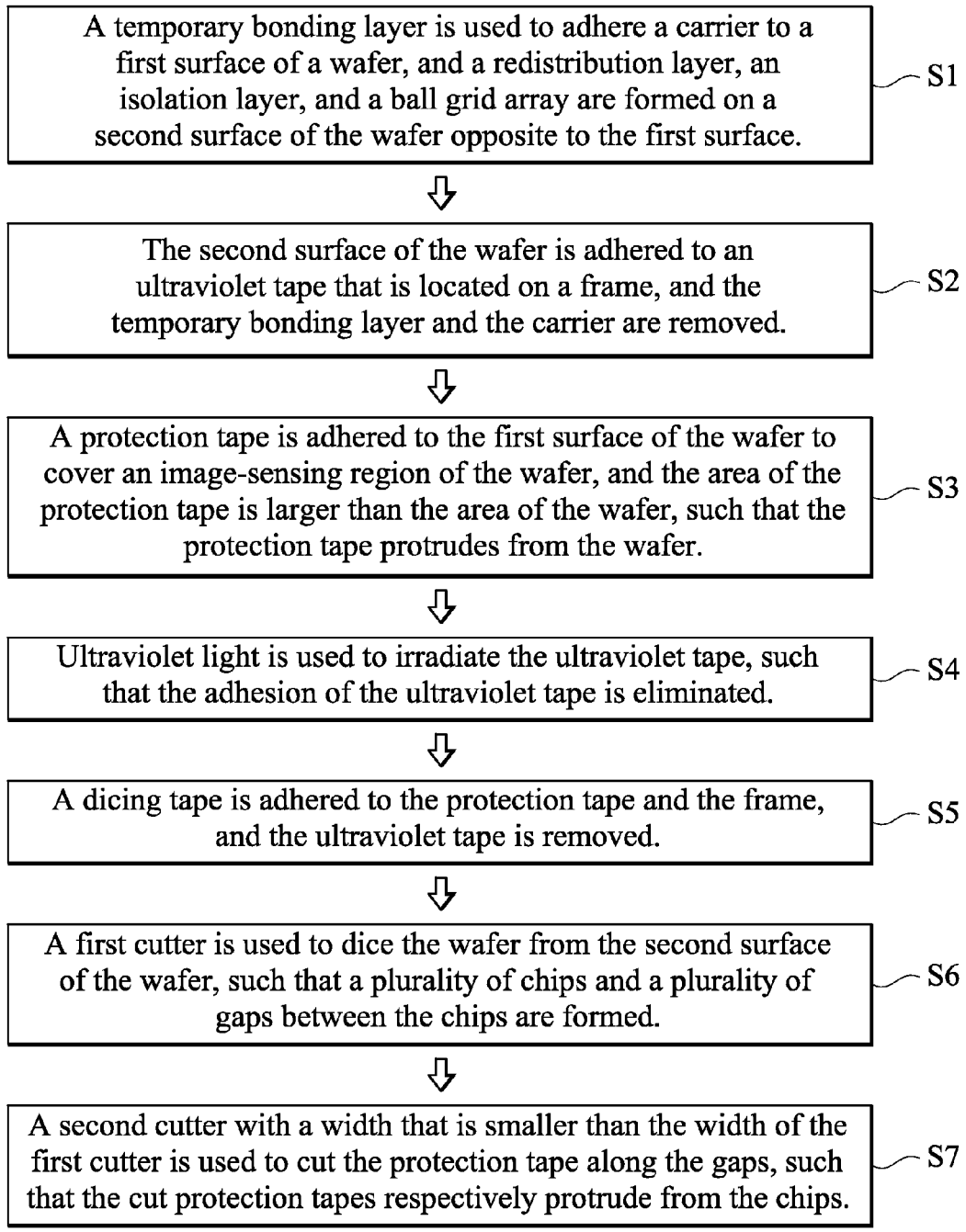
FIG. 1 is a flow chart of a manufacturing method of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a manufacturing method of a semiconductor structure according to one embodiment of the present invention. In step S1, a temporary bonding layer is used to adhere a carrier to a first surface of a wafer, and a redistribution layer, an isolation layer, and a ball grid array are formed on a second surface of the wafer opposite to the first surface. Thereafter in step S2, the second surface of the wafer is adhered to an ultraviolet tape that is located on a frame, and the temporary bonding layer and the carrier are removed. Next in step S3, a protection tape is adhered to the first surface of the wafer to cover an image-sensing region of the wafer, and the area of the protection tape is larger than the area of the wafer, such that the protection tape protrudes from the wafer. Thereafter in step S4, ultraviolet light is used to irradiate the ultraviolet tape, such that the adhesion of the ultraviolet tape is eliminated. Next in step S5, a dicing tape is adhered to the protection tape and the frame, and the ultraviolet tape is removed. Thereafter in step S6, a first cutter is used to dice the wafer from the second surface of the wafer, such that a plurality of chips and a plurality of gaps between the chips are formed. Finally in step S7, a second cutter with a width that is smaller than the width of the first cutter is used to cut the protection tape along the gaps, such that the cut protection tapes respectively protrude from the chips. In the following description, the aforesaid steps will be described.

Figure 2A:
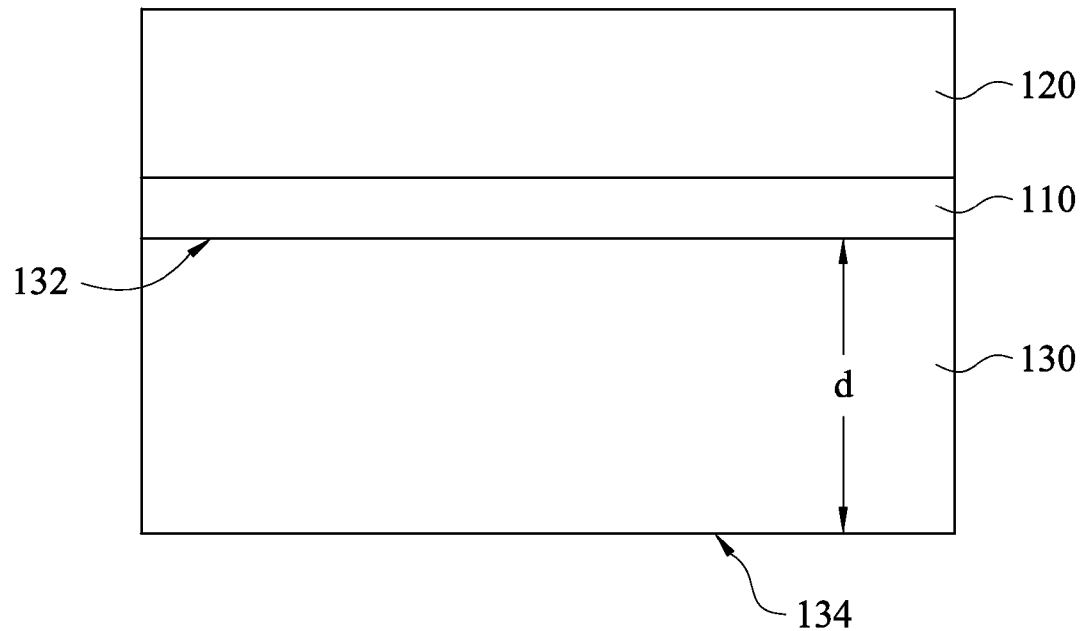
FIGS. 2A to 2D are schematic views of a redistribution layer, an isolation layer, and a ball grid array after being formed on a wafer.
Figure 2B:
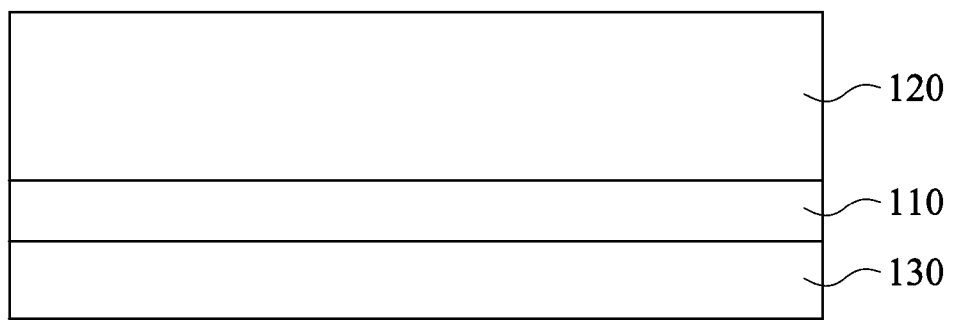
Figure 2C:
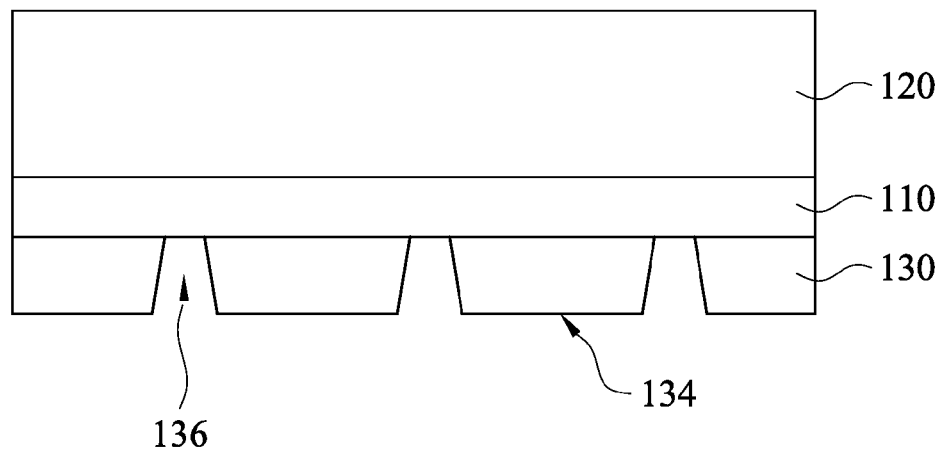
Figure 2D:
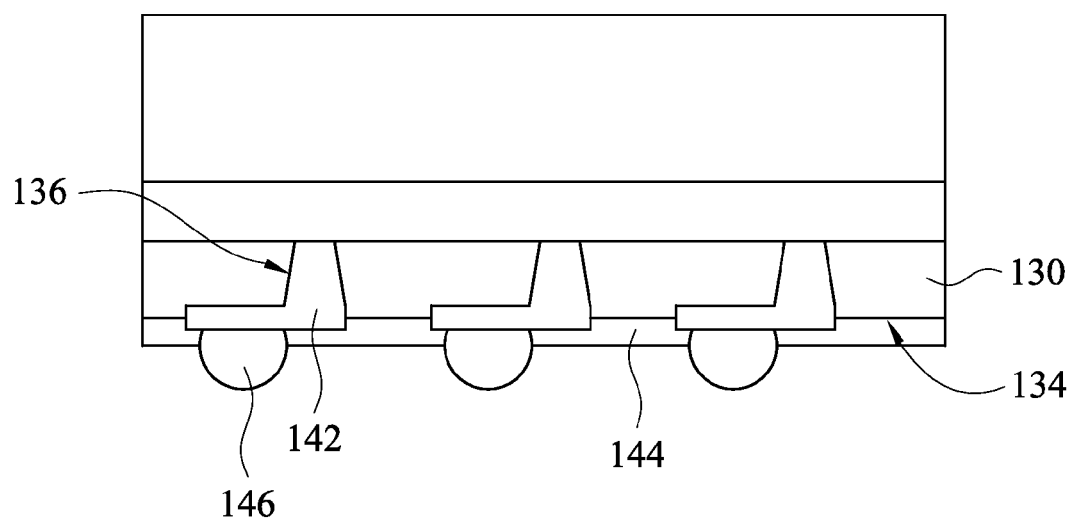

FIGS. 2A to 2D are schematic views of a redistribution layer 142, an isolation layer 144, and a ball grid array 146 after being formed on a wafer 130. As shown in FIG. 2A, a temporary bonding layer 110 is used to adhere a carrier 120 to a first surface 132 of the wafer 130. Thereafter, a second surface 134 of the wafer 130 opposite to the first surface 132 may be ground, such that the thickness d of the wafer 130 is reduced. Therefore, as shown in FIG. 2B, the wafer 130 with a thickness smaller than the thickness d is obtained. As shown in FIG. 2C and 2D, after the thickness of the wafer 130 is reduced, the wafer 130 may be etched, such that a plurality of concave holes 136 are formed in the second surface 134 of the wafer 130. Afterwards, the redistribution layer 142, the isolation layer 144, and the ball grid array 146 (BGA) are formed on the second surface 134 of the wafer 130, and at least a portion of the redistribution layer 142 is located in the concave holes 136.

The carrier 120 may be a glass plate, but the present invention is not limited in this regard. The wafer 130 may be made of a material including silicon, such as a silicon substrate. The carrier 120 may provide a supporting force for the wafer 130 so as to prevent the wafer 130 from being broken during a grinding process. The redistribution layer 142 may be made of a material including aluminum, copper, or other conductive metals. The isolation layer 144 may be a solder mask. The ball grid array 146 may be solder balls. In the next process, the wafer 130 has been through a BGA process.

Figure 3:
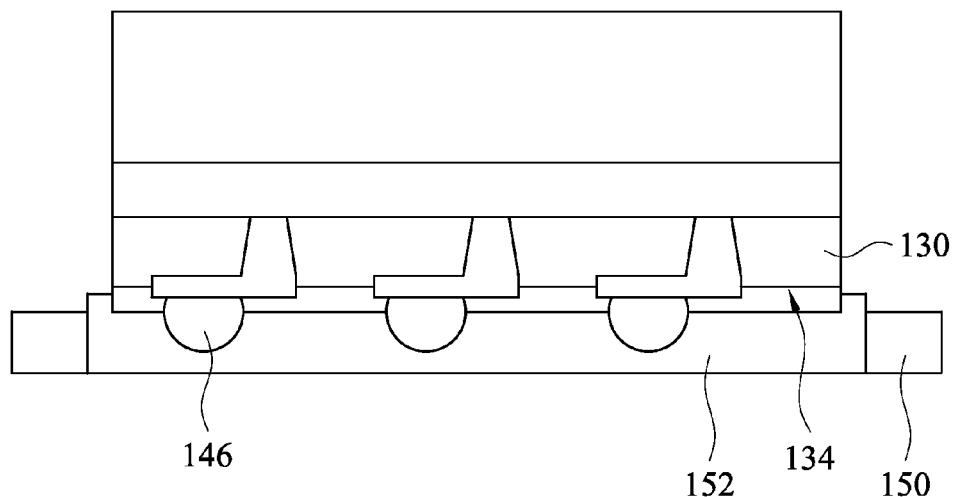
FIG. 3 is a schematic view of the structure shown in FIG. 2D after being adhered to an ultraviolet tape.
Figure 4:
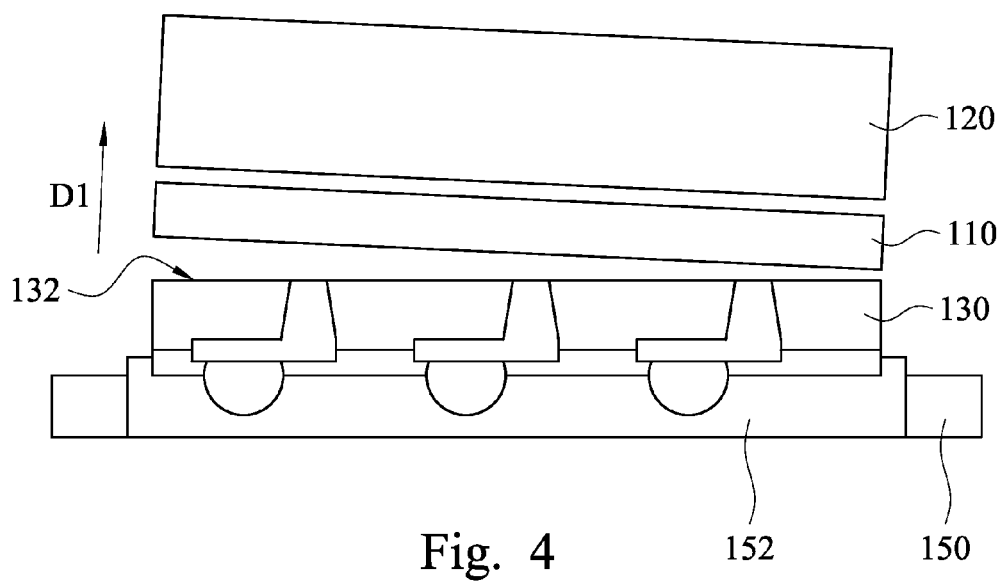
FIG. 4 is a schematic view of a temporary bonding layer and a carrier after being removed from the structure shown in FIG. 3.

FIG. 3 is a schematic view of the structure shown in FIG. 2D after being adhered to an ultraviolet tape 152. FIG. 4 is a schematic view of the temporary bonding layer 110 and the carrier 120 after being removed from the structure shown in FIG. 3. As shown in FIG. 3 and FIG. 4, after the structure shown in FIG. 2D is formed, the second surface 134 of the wafer 130 may be adhered to the ultraviolet tape 152 that is located on a frame 150. The ultraviolet tape 152 is referred to as a tape that may eliminate the adhesion thereof when being irradiate by ultraviolet light. Thereafter, the temporary bonding layer 110 and the carrier 120 may be removed in a direction D1.

Figure 5:
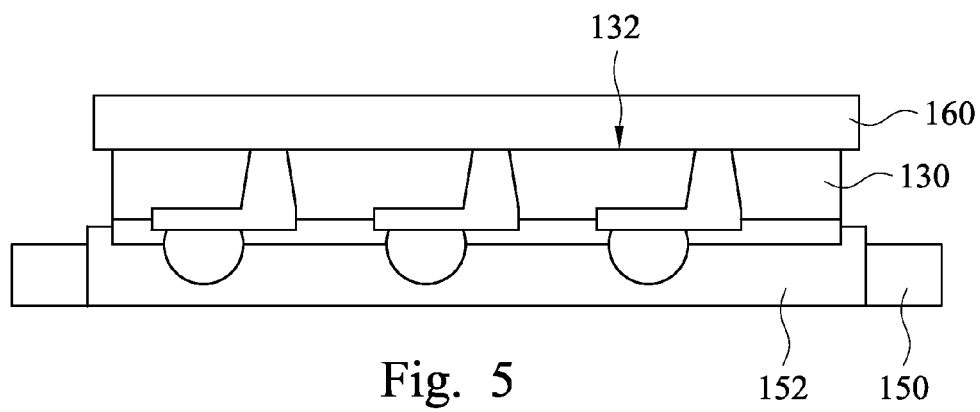
FIG. 5 is a schematic view of the wafer shown in FIG. 4 after being adhered to a protection tape.
Figure 6:
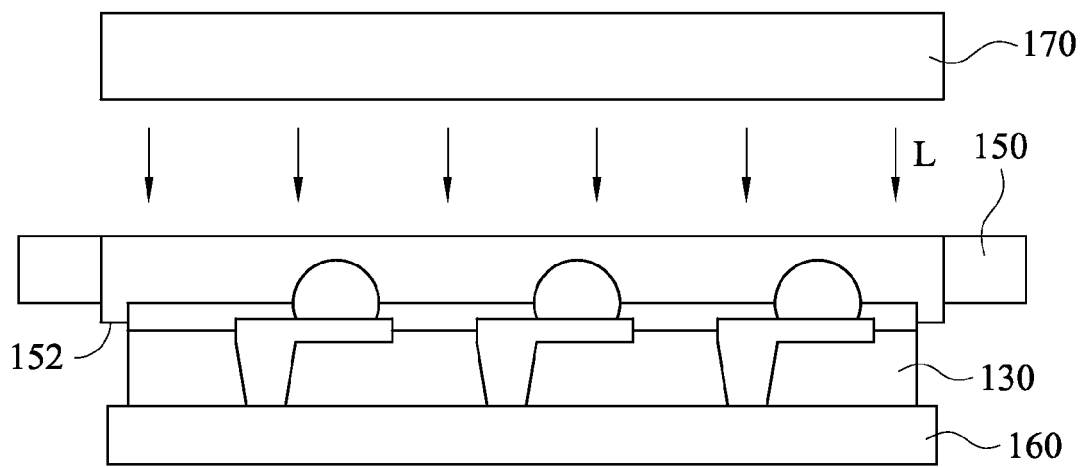
FIG. 6 is a schematic view of the structure shown in FIG. 5 when being irradiated by ultraviolet light.

FIG. 5 is a schematic view of the wafer 130 shown in FIG. 4 after being adhered to a protection tape 160. FIG. 6 is a schematic view of the structure shown in FIG. 5 when being irradiated by ultraviolet light L. As shown in FIGS. 5 and 6, after the temporary bonding layer 110 (see FIG. 4) and the carrier 120 (see FIG. 4) are removed from the first surface 132 of the wafer 130, the protection tape 160 may be adhered to the first surface 132 of the wafer 130 to cover the image-sensing region of the wafer 130. The area of the protection tape 160 is larger than the area of the wafer 130, such that the protection tape 160 protrudes from the edge of the wafer 130. Thereafter, the structure shown in FIG. 5 may be flipped 180 degrees, and the ultraviolet light L of an ultraviolet light source 170 is used to irradiate the ultraviolet tape 152, such that the adhesion of the ultraviolet tape 152 is eliminated.

Figure 7:
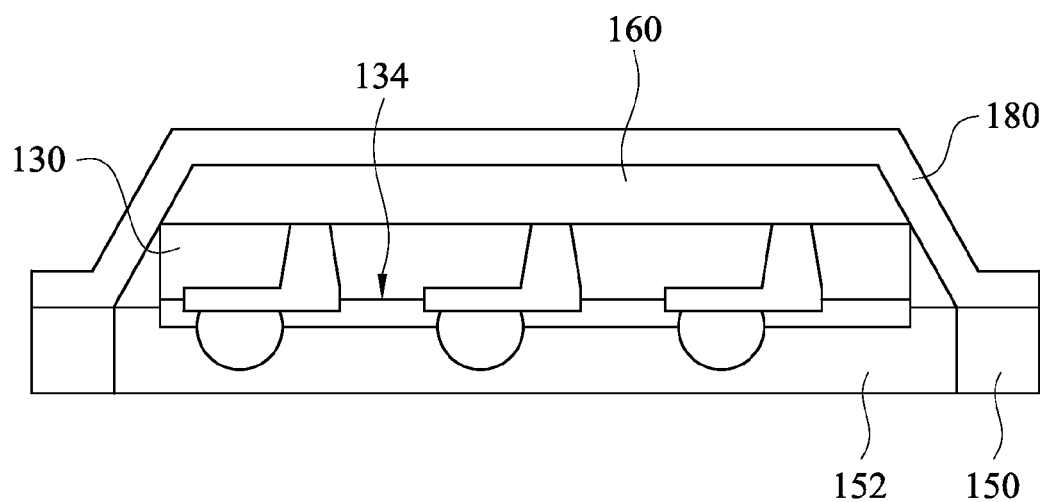

FIG. 7 is a schematic view of the protection tape 160 and the frame 150 shown in FIG. 6 after being adhered to a dicing tape 180. After the ultraviolet tape 152 is exposed to ultraviolet light, the dicing tape 180 may be adhered to the protection tape 160 and the frame 150. Next, the structure shown in FIG. 7 may be flipped 180 degrees. Since the adhesion of the ultraviolet tape 152 is eliminated, the ultraviolet tape 152 is prone to be removed from the second surface 134 of the wafer 130.

Figure 8A:
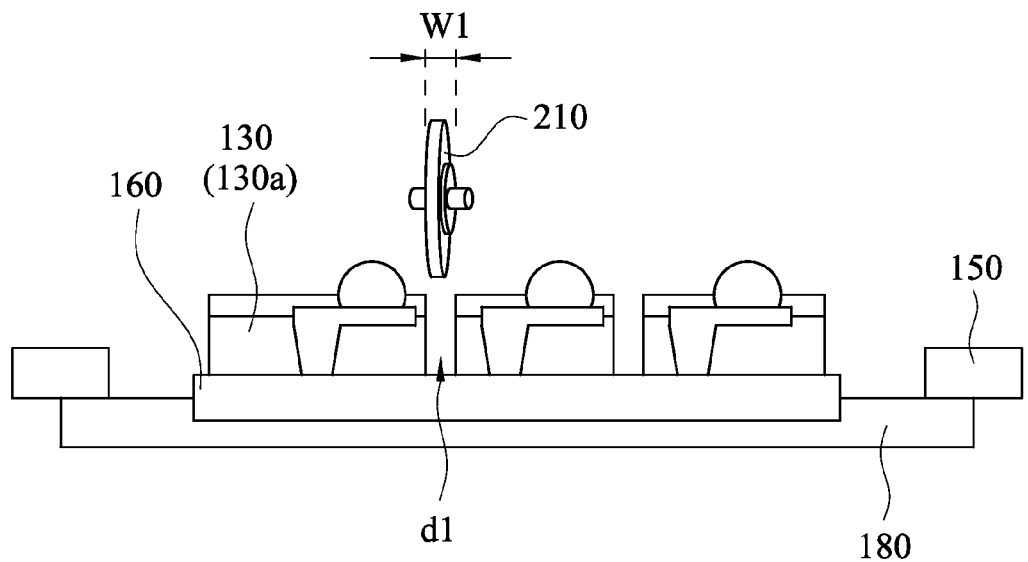
FIG. 8A is a schematic view of the wafer when being diced by a first cutter and after the ultraviolet tape shown in FIG. 7 is removed.
Figure 8B:
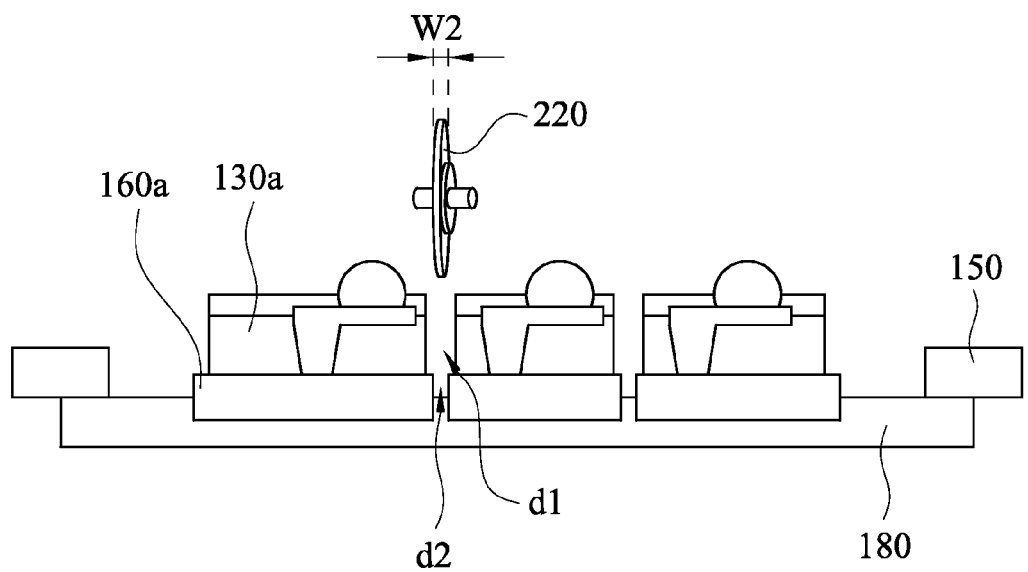
FIG. 8B is a schematic view of the protection tape when being cut by a second cutter and after gaps are formed between chips shown in FIG. 8A.

FIG. 8A is a schematic view of the wafer 130 when being diced by a first cutter 210 and after the ultraviolet tape 152 shown in FIG. 7 is removed. FIG. 8B is a schematic view of the protection tape 160a when being cut by a second cutter 220 and after gaps d1 are formed between chips 130a shown in FIG. 8A. As shown in FIG. 8A and FIG. 8B, after the structure shown in FIG. 7 is flipped 180 degrees and the ultraviolet tape 152 is removed, the first cutter 210 with a width W1 may be used to dice the wafer 130 from the second surface 134 of the wafer 130, such that the chips 130a and the gaps d1 between the chips 130a are formed. Each of the chips 130a is referred to as a piece of the wafer 130 after being diced. After the gaps d1 are formed, the second cutter 220 with a width W2 that is smaller than the width W1 of the first cutter 210 is used to cut the protection tape 160 along the gaps d1, such that the cut protection tapes 160a respectively protrude from the chips 130a. A gap d2 between two of the protection tapes 160a is smaller than the gap d1.

Figure 9:
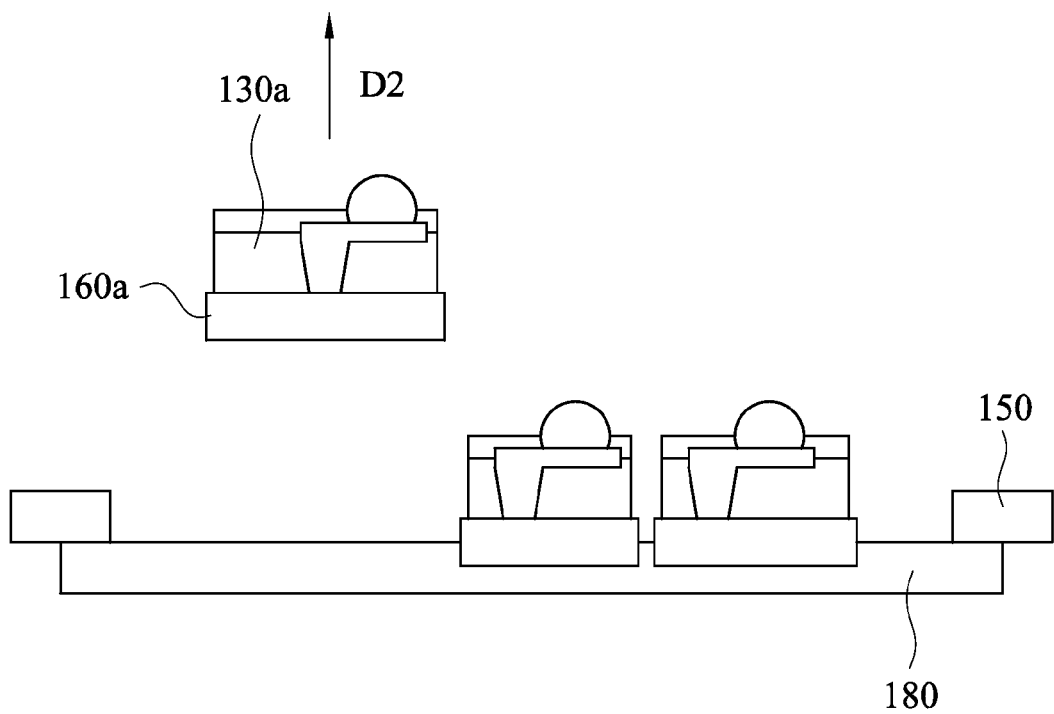
Figure 10:
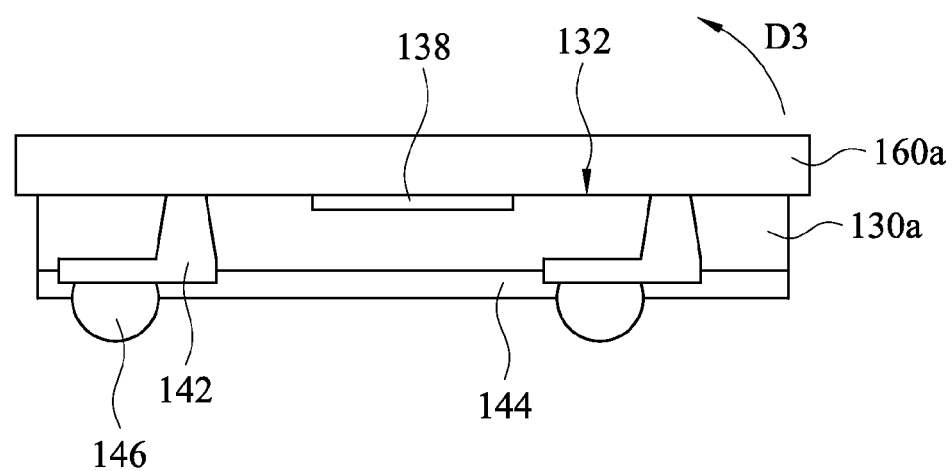
FIG. 10 is an enlarged view of the chip and the protection tape shown in FIG. 9.

FIG. 9 is a schematic view of the chip 130a and the protection tape 160a shown in FIG. 8B after being obtained from the dicing tape 180. FIG. 10 is an enlarged view of the chip 130a and the protection tape 160a shown in FIG. 9. As shown in FIG. 9 and FIG. 10, after the diced chip 130a and the cut protection tape 160a are formed, the chip 130a and the protection tape 160a on the chip 130a can be obtained from the dicing tape 180 in a direction D2. At this moment, the image-sensing region 138 on the first surface 132 of the chip 130a may be protected by the protection tape 160a, and the protection tape 160a protrudes from the edge of the chip 130a. When the chip 130a needs to be assembled to an electronic device, the protection tape 160a may be apt to be torn from the edge of the chip 130a (e.g., in a direction D3). The chip 130a may be an image-sensing chip, such as a front side or back side illumination CMOS chip.

Compared with the manufacturing method of the semiconductor structure and prior art, the carrier may provide a supporting force for the wafer before the ball grid array is formed on the wafer. After the second surface of the wafer is adhered to the ultraviolet tape, the temporary bonding layer and the carrier may be removed. The carrier and the protection tape both can protect the image-sensing region of the wafer, such that the image-sensing region is prevented from pollution in a manufacturing process, and the yield rate of the semiconductor structure may be improved. In addition, since the area of the protection tape is larger than the area of the wafer and the wider first cutter is used to cut the wafer and the narrower second cutter is used to cut the protection tape, each of the protection tapes on one of the chips protrudes from the corresponding chip after the wafer and the protection tape are cut. As a result, the protection tapes may be easily torn from the edges of the chips, thereby improving convenience in manufacturing. Moreover, the chip after the carrier and the protection tape are removed may enhance the sensing capability of the chip, and the cost of disposing a glass sheet on a chip in conventional art is saved.

It is to be noted that the connection relationships and materials of the elements described above will not be repeated in the following description.

Figure 11:
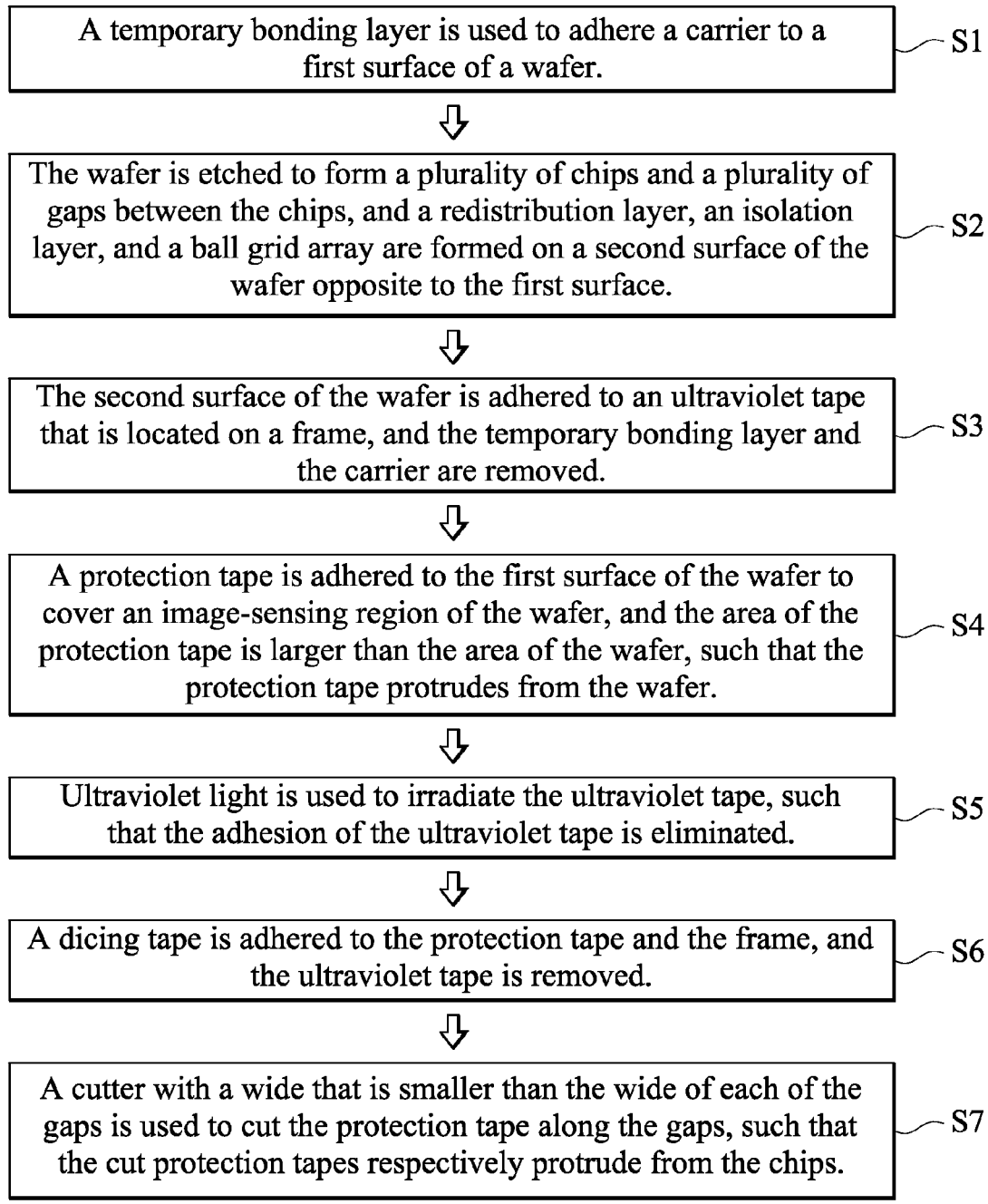
FIG. 11 is a flow chart of a manufacturing method of a semiconductor structure according to one embodiment of the present invention.

FIG. 11 is a flow chart of a manufacturing method of a semiconductor structure according to one embodiment of the present invention. In step S1, a temporary bonding layer is used to adhere a carrier to a first surface of a wafer. Thereafter in step S2, the wafer is etched to form a plurality of chips and a plurality of gaps between the chips, and a redistribution layer, an isolation layer, and a ball grid array are formed on a second surface of the wafer opposite to the first surface. Next in step S3, the second surface of the wafer is adhered to an ultraviolet tape that is located on a frame, and the temporary bonding layer and the carrier are removed. Thereafter in step S4, a protection tape is adhered to the first surface of the wafer to cover an image-sensing region of the wafer, and the area of the protection tape is larger than the area of the wafer, such that the protection tape protrudes from the wafer. Next in step S5, ultraviolet light is used to irradiate the ultraviolet tape, such that the adhesion of the ultraviolet tape is eliminated. Thereafter in step S6, a dicing tape is adhered to the protection tape and the frame, and the ultraviolet tape is removed. Finally in step S7, a cutter with a wide that is smaller than the wide of each of the gaps is used to cut the protection tape along the gaps, such that the cut protection tapes respectively protrude from the chips. In the following description, the aforesaid steps will be described.

Figure 12A:
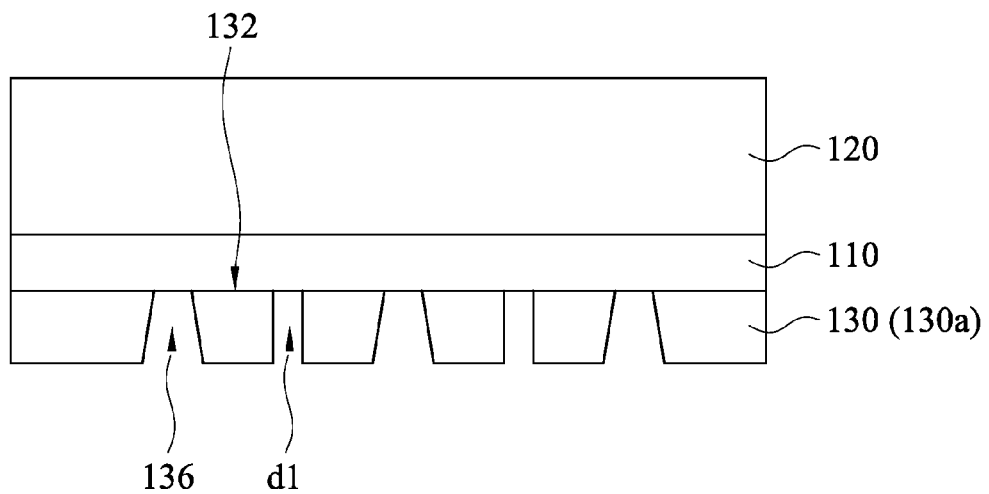
FIGS. 12A and 12B are schematic views of the redistribution layer, the isolation layer, and the ball grid array after being formed on the wafer.
Figure 12B:
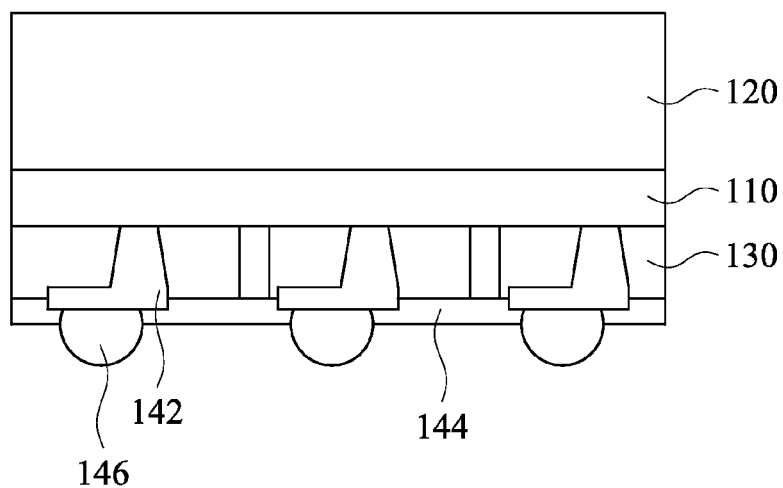

FIGS. 12A and 12B are schematic views of the redistribution layer 142, the isolation layer 144, and the ball grid array 146 after being formed on the wafer 130. The carrier 120 shown in FIG. 12A has been adhered to the first surface 132 of the wafer 130 by utilizing the temporary bonding layer 110, and the second surface 134 of the wafer 130 has been ground. The aforesaid manufacturing processes are similar to FIG. 2A and FIG. 2B, and will not be described again. After the thickness of the wafer 130 is reduced, the wafer 130 may be etched, such that the concave holes 136 are formed in the second surface 134 of the wafer 130, and the chips 130a and the gaps d1 between the chips 130a may be formed by an etching process. In order to simplify the following description, the wafer 130 is referred to as a collection of the chips 130a. Thereafter, the redistribution layer 142, the isolation layer 144, and the ball grid array 146 may be formed on the second surface 134 of the wafer 130, and at least a portion of the redistribution layer 142 is located in the concave holes 136.

Figure 13:
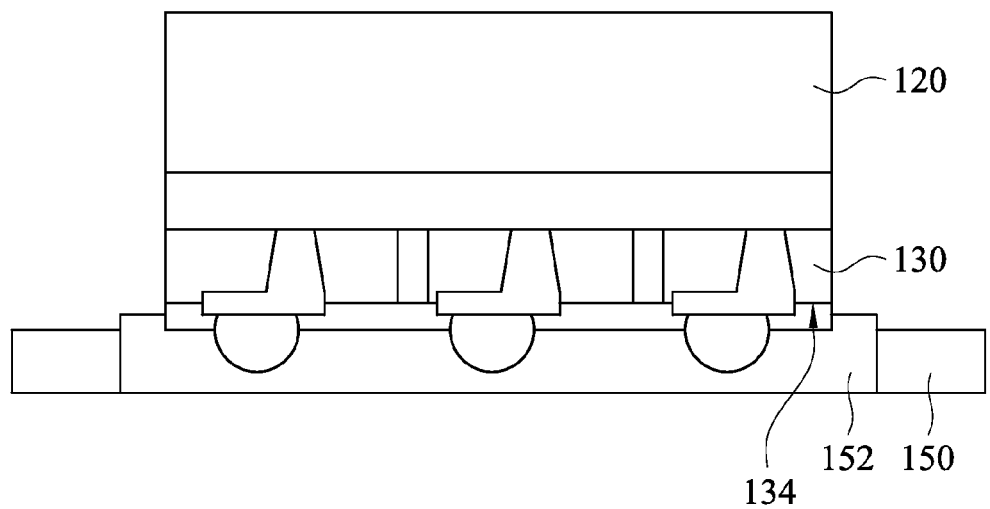
FIG. 13 is a schematic view of the structure shown in FIG. 12B after being adhered to the ultraviolet tape.
Figure 14:
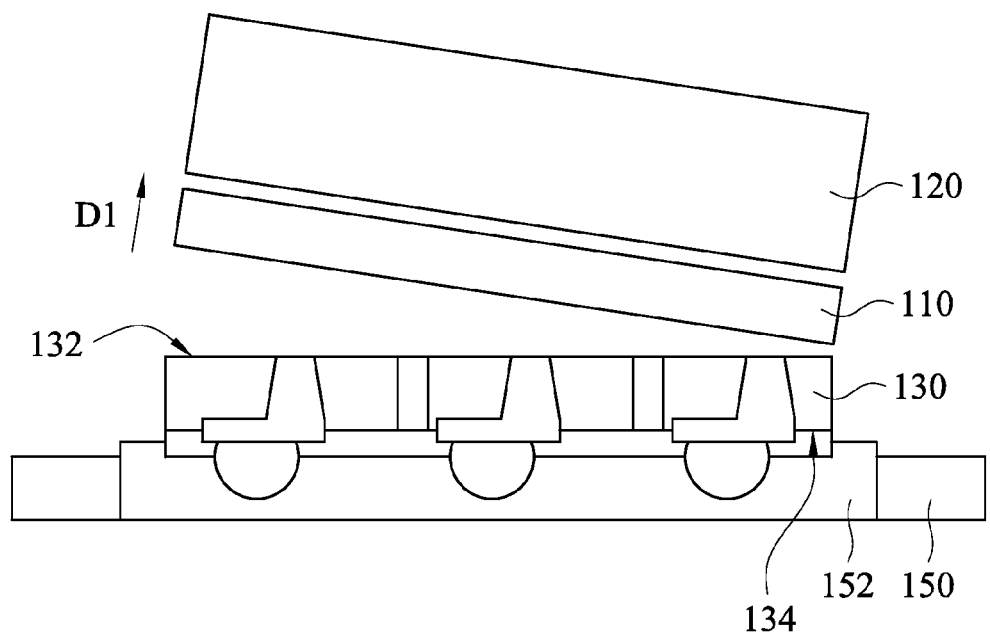
FIG. 14 is a schematic view of the temporary bonding layer and the carrier after being removed from the structure shown in FIG. 13.

FIG. 13 is a schematic view of the structure shown in FIG. 12B after being adhered to the ultraviolet tape 152. FIG. 14 is a schematic view of the temporary bonding layer 110 and the carrier 120 after being removed from the structure shown in FIG. 13. As shown in FIG. 13 and FIG. 14, after the structure shown in FIG. 12B is formed, the second surface 134 of the wafer 130 may be adhered to the ultraviolet tape 152 that is located on the frame 150. Thereafter, the temporary bonding layer 110 and the carrier 120 may be removed in the direction D1.

Figure 15:
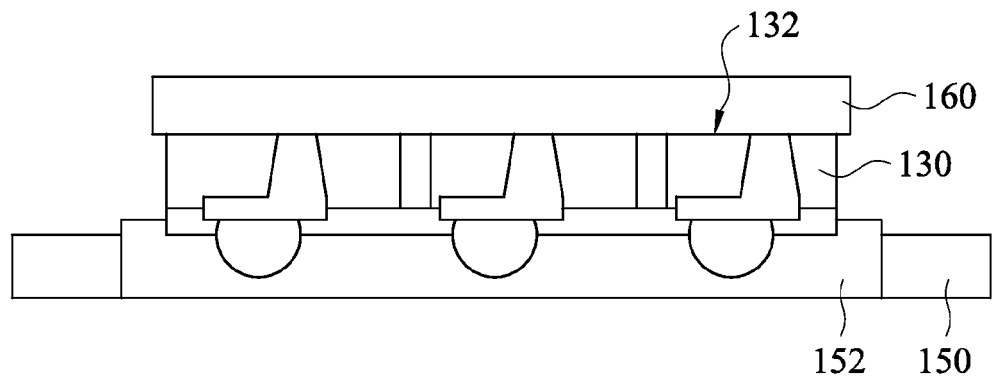
FIG. 15 is a schematic view of the wafer shown in FIG. 4 after being adhered to the protection tape.
Figure 16:
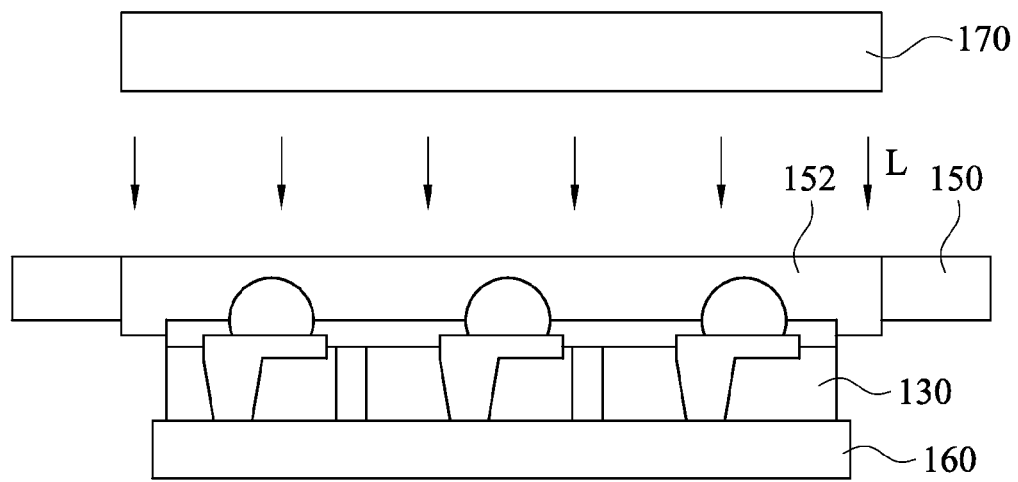
FIG. 16 is a schematic view of the structure shown in FIG. 15 when being irradiated by ultraviolet light.

FIG. 15 is a schematic view of the wafer 130 shown in FIG. 4 after being adhered to the protection tape 160. FIG. 16 is a schematic view of the structure shown in FIG. 15 when being irradiated by ultraviolet light L. As shown in FIG. 15 and FIG. 16, after the temporary bonding layer 110 (see FIG. 14) and the carrier 120 (see FIG. 14) are removed from the first surface 132 of the wafer 130, the protection tape 160 may be adhered to the first surface 132 of the wafer 130 to cover the image-sensing region of the wafer 130. The area of the protection tape 160 is larger than the area of the wafer 130, such that the protection tape 160 protrudes from the edge of the wafer 160. Thereafter, the structure shown in FIG. 15 may be flipped 180 degrees, and the ultraviolet light L of the ultraviolet light source 170 is used to irradiate the ultraviolet tape 152, such that the adhesion of the ultraviolet tape 152 is eliminated.

Figure 17:
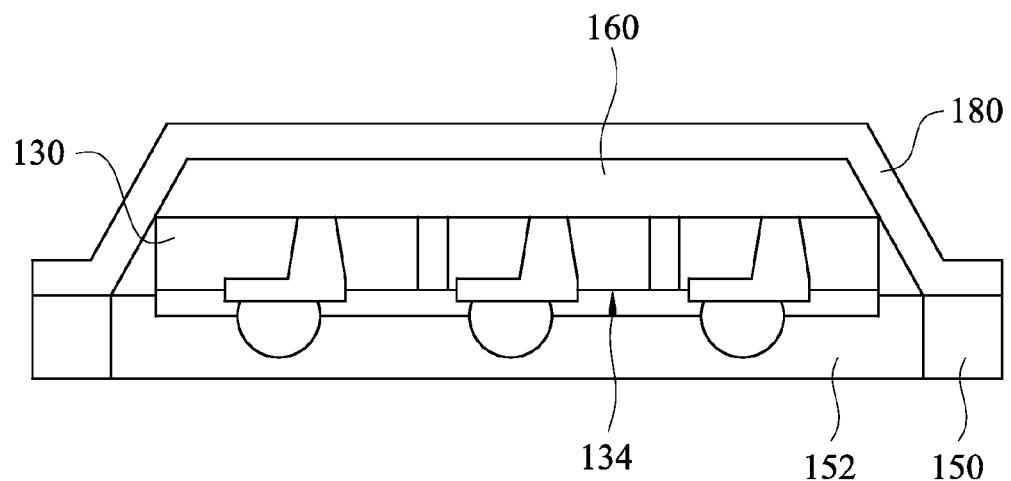
FIG. 17 is a schematic view of the protection tape and the frame shown in FIG. 16 after being adhered to the dicing tape.

FIG. 17 is a schematic view of the protection tape 160 and the frame 150 shown in FIG. 16 after being adhered to the dicing tape 180. After the ultraviolet tape 152 is exposed to ultraviolet light, the dicing tape 180 may be adhered to the protection tape 160 and the frame 150. Next, the structure shown in FIG. 17 may be flipped 180 degrees. Since the adhesion of the ultraviolet tape 152 is eliminated, the ultraviolet tape 152 is prone to be removed from the second surface 134 of the wafer 130.

Figure 18:
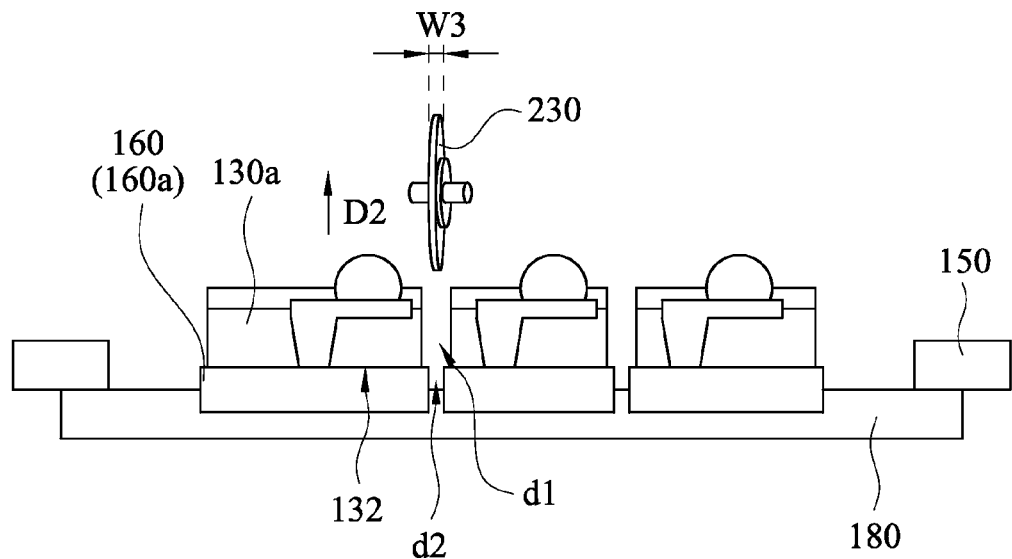
FIG. 18 is a schematic view of the protection tape when being cut by a cutter and after the ultraviolet tape shown in FIG. 17 is removed.

FIG. 18 is a schematic view of the protection tape 160 when being cut by a cutter 230 and after the ultraviolet tape 160 shown in FIG. 17 is removed. The gaps d1 and the chips 130a have been formed in FIG. 12A. Therefore, the cutter 230 with a wide W3 that is smaller than the wide of each of the gaps d1 may be used to cut the protection tape 160 along the gaps d1, such that the cut protection tapes 160a respectively protrude from the chips 130a. A gap d2 between two of the protection tapes 160a is smaller than the gap d1. After the diced chips 130a and the cut protection tapes 160a are formed, the chip 130a and the protection tape 160a on the chip 130a may be obtained from the dicing tape 180 in the direction D2. At this moment, the image-sensing region on the first surface 132 of the chip 130a may be protected by the protection tape 160a, and the protection tape 160a protrudes from the edge of the chip 130a. When the chip 130a needs to be assembled to an electronic device, the protection tape 160a may be apt to be torn from the edge of the chip 130a.

Compared with the manufacturing method of the semiconductor structure and prior art, the carrier may provide a supporting force for the wafer before the ball grid array is formed on the wafer. After the second surface of the wafer is adhered to the ultraviolet tape, the temporary bonding layer and the carrier may be removed. The carrier and the protection tape both can protect the image-sensing region of the wafer, such that the image-sensing region is prevented from pollution in a manufacturing process, and the yield rate of the semiconductor structure may be improved. In addition, when the wafer is etched, the chips and the gaps may be formed. Since the area of the protection tape is larger than the area of the wafer and the cutter with a wide that is smaller than the wide of the gap is used to cut the protection tape, each of the protection tapes on one of the chips protrudes from the corresponding chip after the protection tape is cut. As a result, the protection tapes may be easily torn from the edges of the chips, thereby improving convenience in manufacturing. Moreover, the chip after the carrier and the protection tape are removed may enhance the sensing capability of the chip, and the cost of disposing a glass sheet on a chip in conventional art is saved.

FIG. 19 is a flow chart of a manufacturing method of a semiconductor structure according to one embodiment of the present invention. In step S1, a temporary bonding layer is used to adhere a carrier to a first surface of a wafer, such that the temporary bonding layer covers an image-sensing region of the wafer. Thereafter in step S2, the wafer is etched to form a plurality of chips and a plurality of gaps between the chips, and a redistribution layer, an isolation layer, and a ball grid array are formed on a second surface of the wafer opposite to the first surface. Next in step S3, the second surface of the wafer is adhered to an ultraviolet tape that is located on a frame, and the carrier is removed, and the area of the temporary bonding layer is larger than the area of the wafer, such that the temporary bonding layer protrudes from the wafer.

Thereafter in step S4, a cutter with a wide that is smaller than the wide of each of the gaps is used to cut positions of the temporary bonding layer aligned with the gaps, such that the cut temporary bonding layers respectively protrude from the chips. Finally in step S5, ultraviolet light is used to irradiate the ultraviolet tape, such that the adhesion of the ultraviolet tape is eliminated.

In this embodiment, step S1 and step S2 are similar to the manufacturing processes shown in FIG. 12A to FIG. 13, and will not described again.

Figure 20:
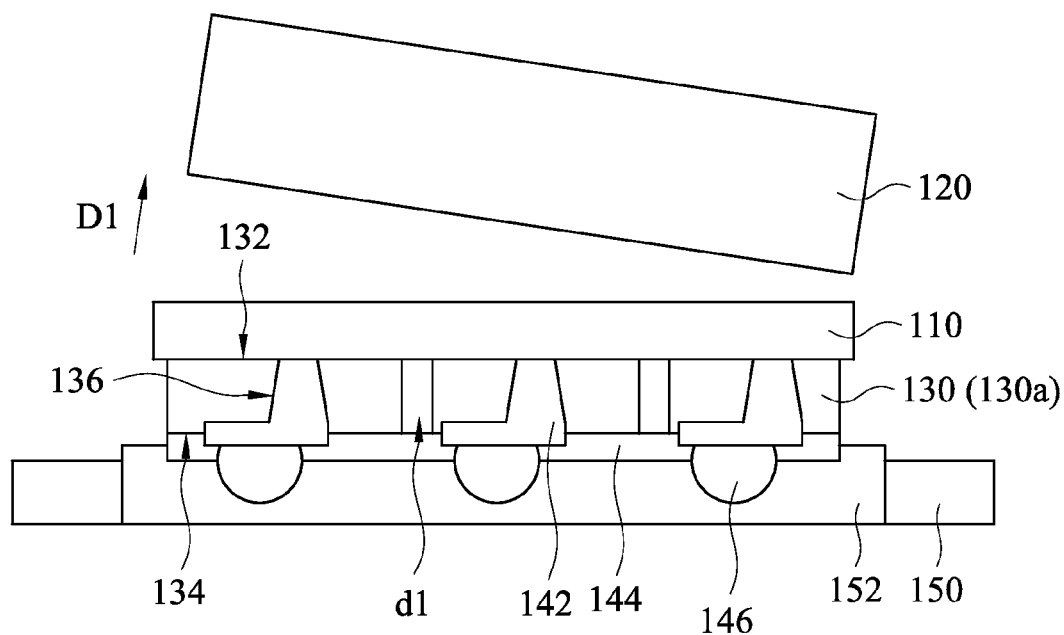
FIG. 20 is a schematic view of the carrier after being removed from the structure shown in FIG. 13.

FIG. 20 is a schematic view of the carrier 120 after being removed from the structure shown in FIG. 13. The chips 130a and the gaps d1 between the chips 130a have been formed by performing an etching process upon the wafer 130. In order to simplify the following description, the wafer 130 is referred to as a collection of the chips 130a. The redistribution layer 142, the isolation layer 144, and the ball grid array 146 have been formed on the second surface 134 of the wafer 130, and at least a portion of the redistribution layer 142 is located in the concave holes 136.

In this embodiment, after the second surface 134 of the wafer 130 is adhered to the ultraviolet tape 152 that is located on the frame 150, the carrier 120 can be removed in the direction D1, and the temporary bonding layer 110 is still adhered to the first surface 132 of the wafer 130. The area of the temporary bonding layer 110 is larger than the area of the wafer 130, such that the temporary bonding layer 110 protrudes the edge of the wafer 130.

Figure 21:
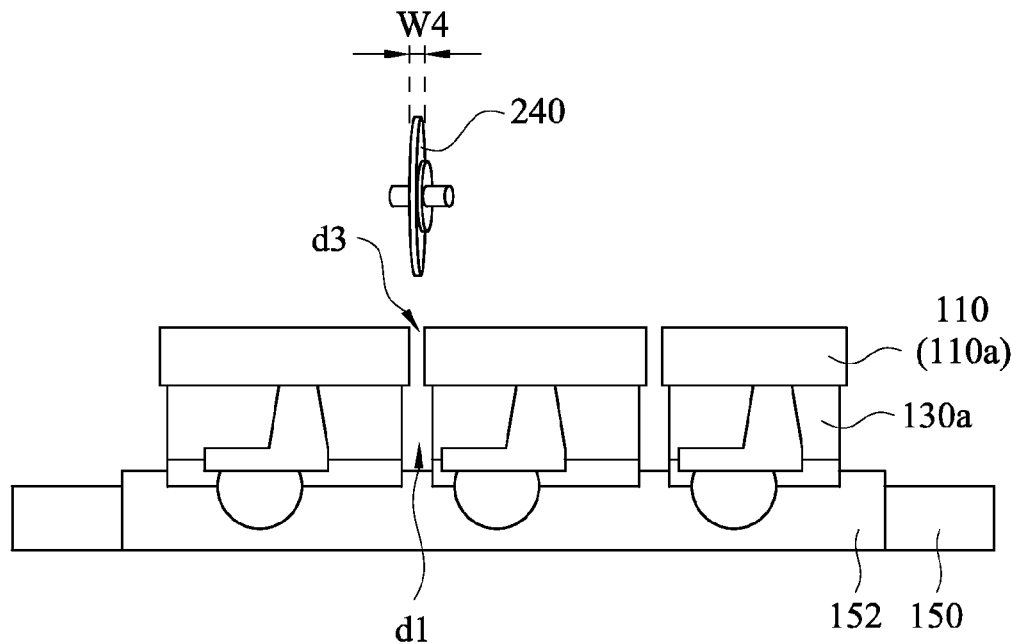
FIG. 21 is a schematic view of the temporary bonding layer when being cut by a cutter and after the carrier shown in FIG. 20 is removed.

FIG. 21 is a schematic view of the temporary bonding layer 120 when being cut by a cutter 240 and after the carrier 120 shown in FIG. 20 is removed. After the carrier 120 (see FIG. 20) is removed from the first surface 132 of the wafer 130, the cutter 240 with a wide W4 that is smaller than the wide of each of the gaps d1 may be used to cut positions of the temporary bonding layer 110 aligned with the gaps d1, such that the cut temporary bonding layers 110a respectively protrude from the chips 130a.

Figure 22:
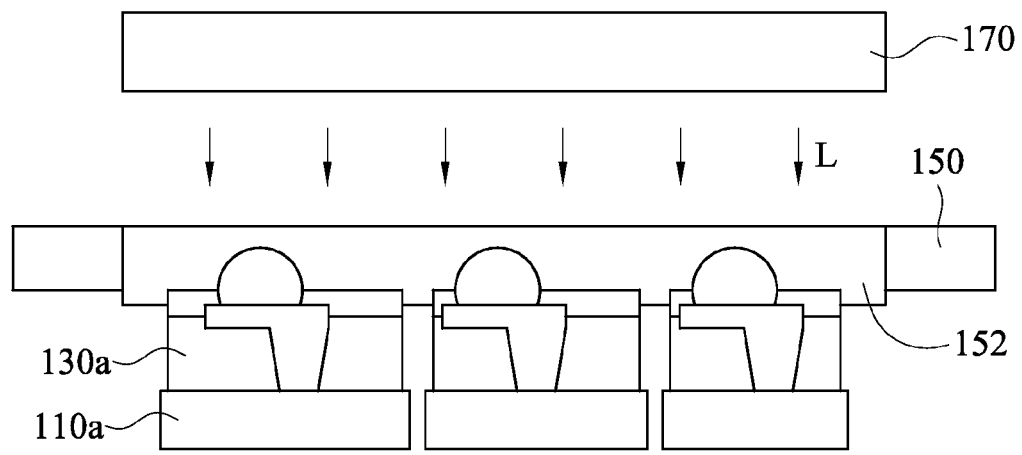
FIG. 22 is a schematic view of the structure shown in FIG. 21 when being irradiated by ultraviolet light.

FIG. 22 is a schematic view of the structure shown in FIG. 21 when being irradiated by ultraviolet light. After the diced chips 130a and the cut temporary bonding layers 110a are formed, the structure shown in FIG. 21 may be flipped 180 degrees, and the ultraviolet light L is used to irradiate the ultraviolet tape 152, such that the adhesion of the ultraviolet tape 152 is eliminated. After the ultraviolet light L irradiates the ultraviolet tape 152, the structure shown in FIG. 22 is flipped 180 degrees, as shown in FIG. 23.

Figure 23:
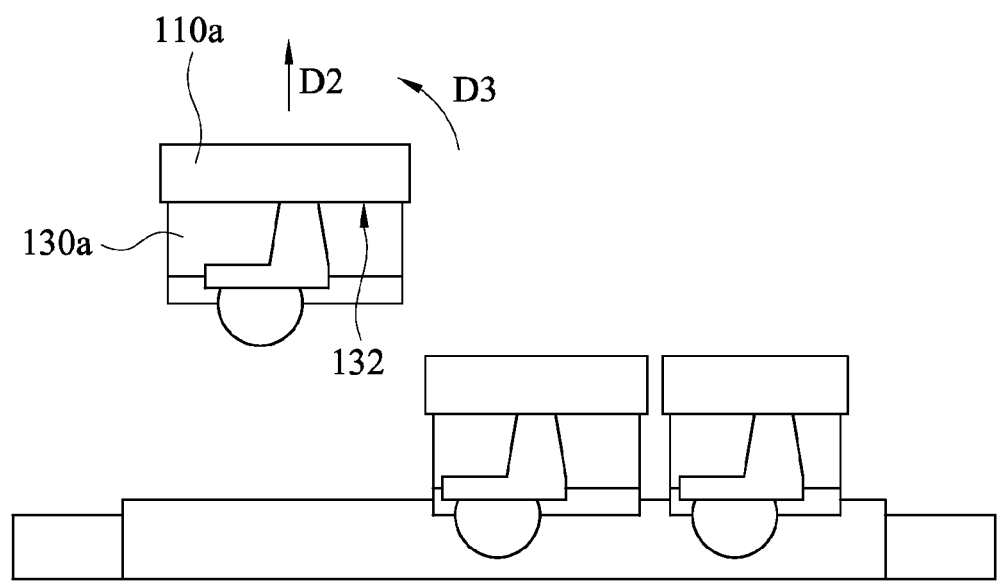
FIG. 23 is a schematic view of the chip and the temporary bonding layer shown in FIG. 22 after being obtained from the ultraviolet tape.

FIG. 23 is a schematic view of the chip 130a and the temporary bonding layer 110a shown in FIG. 22 after being obtained from the ultraviolet tape 152. Since the adhesion of the ultraviolet tape 152 is eliminated, the chip 130a and the temporary bonding layer 110a on the chip 130a are prone to be removed from the ultraviolet tape 152 in the direction D2. At this moment, the image-sensing region on the first surface 132 of the chip 130a may be protected by the temporary bonding layer 110a, and the temporary bonding layer 110a protrudes from the edge of the chip 130a. When the chip 130a needs to be assembled to an electronic device, the temporary bonding layer 110a may be apt to be torn from the edge of the chip 130a in the direction D3.

Compared with the manufacturing method of the semiconductor structure and prior art, the carrier may provide a supporting force for the wafer before the ball grid array is formed on the wafer. After the second surface of the wafer is adhered to the ultraviolet tape, the carrier may be removed. The carrier and the temporary bonding layer both can protect the image-sensing region of the wafer, such that the image-sensing region is prevented from pollution in a manufacturing process, and the yield rate of the semiconductor structure may be improved. In addition, when the wafer is etched, the chips and the gaps may be formed. Since the area of the temporary bonding layer is larger than the area of the wafer and the cutter with a width that is smaller than the width of the gap is used to cut the temporary bonding layer, each of the temporary bonding layers on one of the chips protrudes from the corresponding chip after the temporary bonding layer is cut. As a result, the temporary bonding layers may be easily torn from the edges of the chips, thereby improving convenience in manufacturing. Moreover, the chip after the carrier and the temporary bonding layer are removed may enhance the sensing capability of the chip, and the cost of disposing a glass sheet on a chip in conventional art is saved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a semiconductor structure, comprising:
   (a) using a temporary bonding layer to adhere a carrier to a first surface of a wafer, and forming a redistribution layer, an isolation layer, and a ball grid array on a second surface of the wafer opposite to the first surface;
   (b) adhering the second surface of the wafer to an ultraviolet tape that is located on a frame, and removing the temporary bonding layer and the carrier;
   (c) adhering a protection tape to the first surface of the wafer to cover an image-sensing region of the wafer, wherein an area of the protection tape is larger than an area of the wafer, such that the protection tape protrudes from the wafer;
   (d) using ultraviolet light to irradiate the ultraviolet tape, such that adhesion of the ultraviolet tape is eliminated;
   (e) adhering a dicing tape to the protection tape and the frame, and removing the ultraviolet tape;
   (f) using a first cutter to dice the wafer from the second surface of the wafer, such that a plurality of chips and a plurality of gaps between the chips are formed; and
   (g) using a second cutter with a width that is smaller than a width of the first cutter to cut the protection tape along the gaps, such that the cut protection tapes respectively protrude from the chips.

2. The manufacturing method of the semiconductor structure of claim 1, wherein step (a) further comprises:
   grinding the second surface of the wafer, such that a thickness of the wafer is reduced.

3. The manufacturing method of the semiconductor structure of claim 1, wherein step (a) further comprises:
   etching the wafer to form a plurality of concave holes, wherein at least a portion of the redistribution layer is located in the concave holes.

4. The manufacturing method of the semiconductor structure of claim 1, further comprising:
   obtaining the chips and the protection tapes from the dicing tape; and
   tearing the protection tapes from edges of the chips.

5. A manufacturing method of a semiconductor structure, comprising:
- (a) using a temporary bonding layer to adhere a carrier to a first surface of a wafer;
- (b) etching the wafer to form a plurality of chips and a plurality of gaps between the chips, and forming a redistribution layer, an isolation layer, and a ball grid array on a second surface of the wafer opposite to the first surface;
- (c) adhering the second surface of the wafer to an ultraviolet tape that is located on a frame, and removing the temporary bonding layer and the carrier;
- (d) adhering a protection tape to the first surface of the wafer to cover an image-sensing region of the wafer, wherein an area of the protection tape is larger than an area of the wafer, such that the protection tape protrudes from the wafer;
- (e) using ultraviolet light to irradiate the ultraviolet tape, such that adhesion of the ultraviolet tape is eliminated;
- (f) adhering a dicing tape to the protection tape and the frame, and removing the ultraviolet tape; and
- (g) using a cutter with a width that is smaller than a width of each of the gaps to cut the protection tape along the gaps, such that the cut protection tapes respectively protrude from the chips.

6. The manufacturing method of the semiconductor structure of claim 5, wherein step (a) further comprises:
grinding the second surface of the wafer, such that a thickness of the wafer is reduced.

7. The manufacturing method of the semiconductor structure of claim 5, wherein step (b) further comprises:
etching the wafer to form a plurality of concave holes, wherein at least a portion of the redistribution layer is located in the concave holes.

8. The manufacturing method of the semiconductor structure of claim 5, further comprising:
obtaining the chips and the protection tapes from the dicing tape; and
tearing the protection tapes from edges of the chips.

9. A manufacturing method of a semiconductor structure, comprising:
- (a) using a temporary bonding layer to adhere a carrier to a first surface of a wafer, such that the temporary bonding layer covers an image-sensing region of the wafer;
- (b) etching the wafer to form a plurality of chips and a plurality of gaps between the chips, and forming a redistribution layer, an isolation layer, and a ball grid array on a second surface of the wafer opposite to the first surface;
- (c) adhering the second surface of the wafer to an ultraviolet tape that is located on a frame, and removing the carrier, wherein an area of the temporary bonding layer is larger than an area of the wafer, such that the temporary bonding layer protrudes from the wafer;
- (d) using a cutter with a width that is smaller than a width of each of the gaps to cut positions of the temporary bonding layer aligned with the gaps, such that the cut temporary bonding layers respectively protrude from the chips; and
- (e) using ultraviolet light to irradiate the ultraviolet tape, such that adhesion of the ultraviolet tape is eliminated.

10. The manufacturing method of the semiconductor structure of claim 9, wherein step (a) further comprises:
grinding the second surface of the wafer, such that a thickness of the wafer is reduced.

11. The manufacturing method of the semiconductor structure of claim 9, wherein step (b) further comprises:
etching the wafer to form a plurality of concave holes, wherein at least a portion of the redistribution layer is located in the concave holes.

12. The manufacturing method of the semiconductor structure of claim 9, further comprising:
obtaining the chips and the temporary bonding layers from the ultraviolet tape; and
tearing the temporary bonding layers from edges of the chips.

* * * * *